United States Patent [19]

Black

[11] Patent Number: 5,450,326

[45] Date of Patent: Sep. 12, 1995

[54] GRAPHICAL DISPLAY DISCRIMINANT FACTOR INDICATOR FOR ANOMALY IDENTIFICATION IN SEMICONDUCTOR MANUFACTURE BATCH PROCESS

[75] Inventor: Andrew J. Black, Sebastian, Fla.

[73] Assignee: Harris Corporation, Melbourne, Fla.

[21] Appl. No.: 271,292

[22] Filed: Jul. 6, 1994

[51] Int. Cl.[6] .............................................. G06F 17/60
[52] U.S. Cl. ..................................... 364/468; 395/119
[58] Field of Search ........................ 364/148, 188–190, 364/468; 395/119, 120, 140

[56] References Cited

U.S. PATENT DOCUMENTS 4,873,623  10/1989  Lane et al. ............................ 364/188
5,257,345  10/1993  Malm .................................... 395/119

Primary Examiner—Roy N. Envall, Jr.
Assistant Examiner—Steven R. Garland
Attorney, Agent, or Firm—Charles E. Wands

[57] ABSTRACT

A graphics display tool facilitates analysis of product data, to determine at what point or points in a batch manufacturing process sequence the cause of a defective device has occurred. The tool compiles and displays data associated with respective nodes of a multinode sequential flow semiconductor batch manufacturing process, in the form of easily perceived visual indicators, in particular weighted lines that interconnect successive nodes of the process graphically represented by means of a parallel coordinate system. The use of discriminant level-based visual indicator links of the graphics display according enables a system analyst to readily identify a node that is a likely candidate for either the cause of an anomaly that has contributed to a failed wafer, or to identify a node that is likely not to have contributed to a failed wafer.

9 Claims, 2 Drawing Sheets

GRAPHICAL DISPLAY DISCRIMINANT FACTOR INDICATOR FOR ANOMALY IDENTIFICATION IN SEMICONDUCTOR MANUFACTURE BATCH PROCESS

FIELD OF THE INVENTION

The present invention relates in general to the manufacture of semiconductor devices and integrated circuits, and is particularly directed to a new and improved graphics display-based methodology, which plots variable attribute visual indicators, associated with different levels of a discriminant factor, to connect processing variable nodes of a parallel coordinate system plot of the flow path of sequential operations of a batch manufacturing process, in order to facilitate identification of potential product yield-impacting anomalies in the process.

BACKGROUND OF THE INVENTION

Complex industrial processes, such as those used for the manufacture of semiconductor integrated circuit chips, typically employ several tens to hundreds of individual steps, process parameters for many, if not most, of which must be tightly controlled. Because the testing of a semiconductor wafer is not conducted until after the wafer has undergone a large number of critical processing steps, then, when a defective wafer is detected during testing, it is ordinarily not possible to immediately determine at what point in the process the defect was introduced, or what caused the defect. Moreover, the cause of the defect may not necessarily be related to a problem with a particular piece of manufacturing equipment. The problem could be the result of operator error. Whatever the cause, a failed device means a reduction in process yield.

Because the number of variables that could cause a chip to be declared as 'failed' is so large, attempting to track processed wafers through their respective processing flow paths by means of a conventional numerical analysis of parameter data for each node in the process is an extremely cumbersome, if not impossible, task.

SUMMARY OF THE INVENTION

In accordance with the present invention, this seemingly insurmountable analysis problem is effectively alleviated by compiling data associated with the respective nodes of a multi-node sequential flow process, in particular, specified operation points of a semiconductor batch manufacturing process, in the form of easily perceived visual indicators. These visual indicators may, for example, take the form of lines that coincide with paths through which lots travel in the course of the manufacturing process. The lines interconnect successive nodes of the process which is graphically represented by means of a multi parallel axis coordinate system. Prescribed attributes (e.g. type, shade, color, thickness, hatching) of each interconnection line are associated with the number of lots traversing a particular flow path between successive nodes and with levels of a prescribed discriminant factor that has been selected to define the quality of each lot. The discriminant factor may be a general discriminant, such as product yield, or a more specific discriminant, such as that associated with a measured circuit parameter, for example as a prescribed offset voltage or propagation delay, or measurable defects in the materials of the wafer itself. The respective nodes of the process flow display diagram may be associated with any of a diversity of processing factors, including hardware and system personnel who monitor and control the operation of the process, work shift, day-of-week, hour-of-day, etc.

The fundamental mechanism employed by the present invention is the identification of points or nodes in the process where there is substantial commonality among multiple lots of wafers, regardless of the travel paths of the lots through the process. As will be described, the use of discriminant level-based visual indicator links of the graphics display according to the invention enables the system analyst to readily identify a node that is a likely candidate for either the cause of an anomaly that has contributed to a failed wafer, or to identify a node that is likely not to have contributed to a failed wafer; in the latter case, examination of that node's associated processing component may prove to be indicative of a properly operating aspect of the process and thereby useful as a frame of reference for adjusting or calibrating other components of the process.

DETAILED DESCRIPTION

Figure 1:
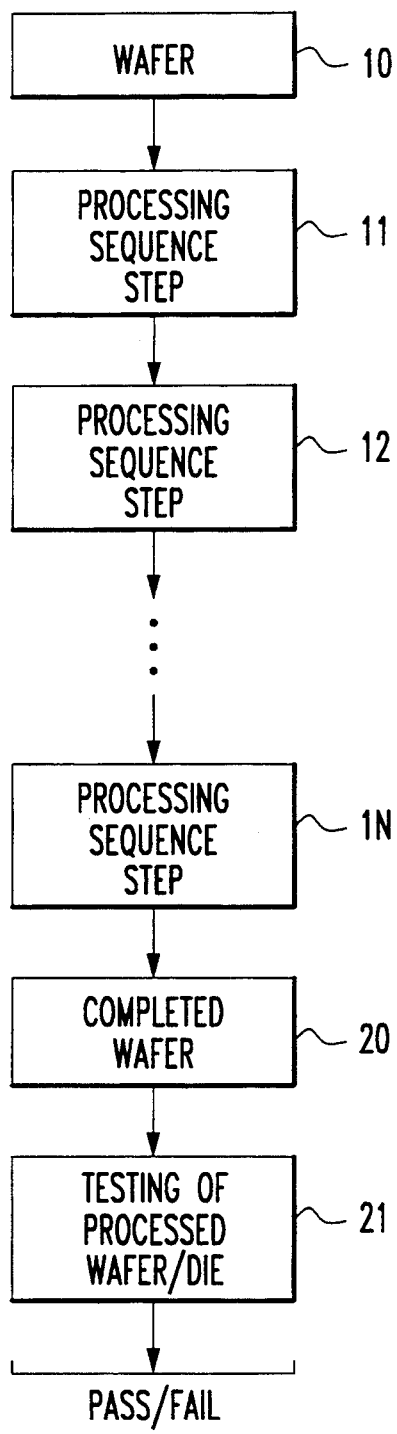
FIG. 1 diagrammatically illustrates an overall process batch sequence through which a semiconductor wafer is processed into a plurality of integrated circuit die.

Before describing in detail the graphics display-based semiconductor batch manufacturing process analysis methodology in accordance with the present invention, it should be observed that the present invention resides primarily in what is effectively a 'visual' product yield analysis tool that enables a process analyst to readily identify where, within a batch flow process sequence, a potential cause of a reduction in product yield may be found. The tool itself is preferably implemented in the form of application software run on a conventional data processing system and displayed on an associated video display terminal. Consequently, the overall configuration of a batch manufacturing process flow sequence has been illustrated in the drawings by a readily understandable block diagram, which shows only those specific details that are pertinent to an understanding of the present invention, so as not to obscure the disclosure with details which will be readily apparent to those skilled in the art having the benefit of the description herein. Thus, the block diagram illustrations of the Figures are primarily intended to illustrate the major components in a convenient functional grouping, whereby the present invention may be more readily understood. (As an adjunct to the present description, Appendix 1 contains pages 1 and 2 of a source code listing of a routine, that may be run any commercially available processing system, such as one employing an S-Plus application program, for generating the parallel coordinate system-based graphics display mechanism of the present invention.)

Referring initially to FIG. 1, an overall process sequence, through which a semiconductor wafer is processed into a plurality of integrated circuit die, each of which is a potential (product yield) candidate as a successfully manufactured and tested circuit device, is diagrammatically illustrated as comprising a sequence of N processing steps 11, 12, ..., 1N, including, but not limited to wafer/chip processing operations customarily employed in the manufacture of semiconductor circuits and devices, such as die patterning (lithography), epitaxial growth, chemical vapor deposition, substrate oxidation, dopant introduction, annealing, passivation, encapsulation, lead attachment, packaging, etc., through which a raw semiconductor (e.g. silicon) wafer 10 is transformed into a plurality of finished devices or die 20. In a typical wafer fabrication sequence it is not uncommon for the number of individual operations to comprise on the order of several tens to several hundred steps. At step 21, the devices are subjected to a prescribed testing procedure, with acceptable devices being classified as PASS and unacceptable devices classified as FAIL.

Typically, wafers are processed in lots, with each wafer in a given lot traversing the same processing operation flow path through the respective operations of the process. In order to maximize throughput and efficiency, the process may employ more than one processing mechanism, e.g. deposition chamber, at a respective operation, so as to accommodate processing of multiple lots at the same time. As a consequence, it can be expected that different lots will not necessarily follow the same travel path from the beginning to the end of the process, so that more travel paths through the sequence flow will be traversed as more and more lots are processed.

For any given processing operation, although it is desired that the conditions for each lot passing through that operation be identical, from a practical standpoint, conditions that may impact the operation may change over time. A not uncommon example is the case of a change (new shift) in the personnel who monitor and control a given piece of processing equipment. It is normally the case that a more experienced individual is less likely to cause misoperation of equipment or misadjustment of processing parameters than an operator with very little familiarity with the system. Thus, even differences in system operator personnel can constitute a control factor in determining product yield. As will be described, the present invention provides a mechanism that allows a system analyst to rapidly locate a likely candidate for the cause of a problem that has led to a reduction in product yield.

More particularly, as pointed out briefly above, in accordance with the data analysis methodology of the present invention, a parallel coordinate system-based graphic display is generated by way of a video display terminal of a data analyst's data processing system. Respective axes of the display are associated with the sequential steps or operations that are performed in the course of a semiconductor batch manufacturing process. At each respective axis, the display shows those process components or participants that are employed for a respective operation in the process.

Figure 2:
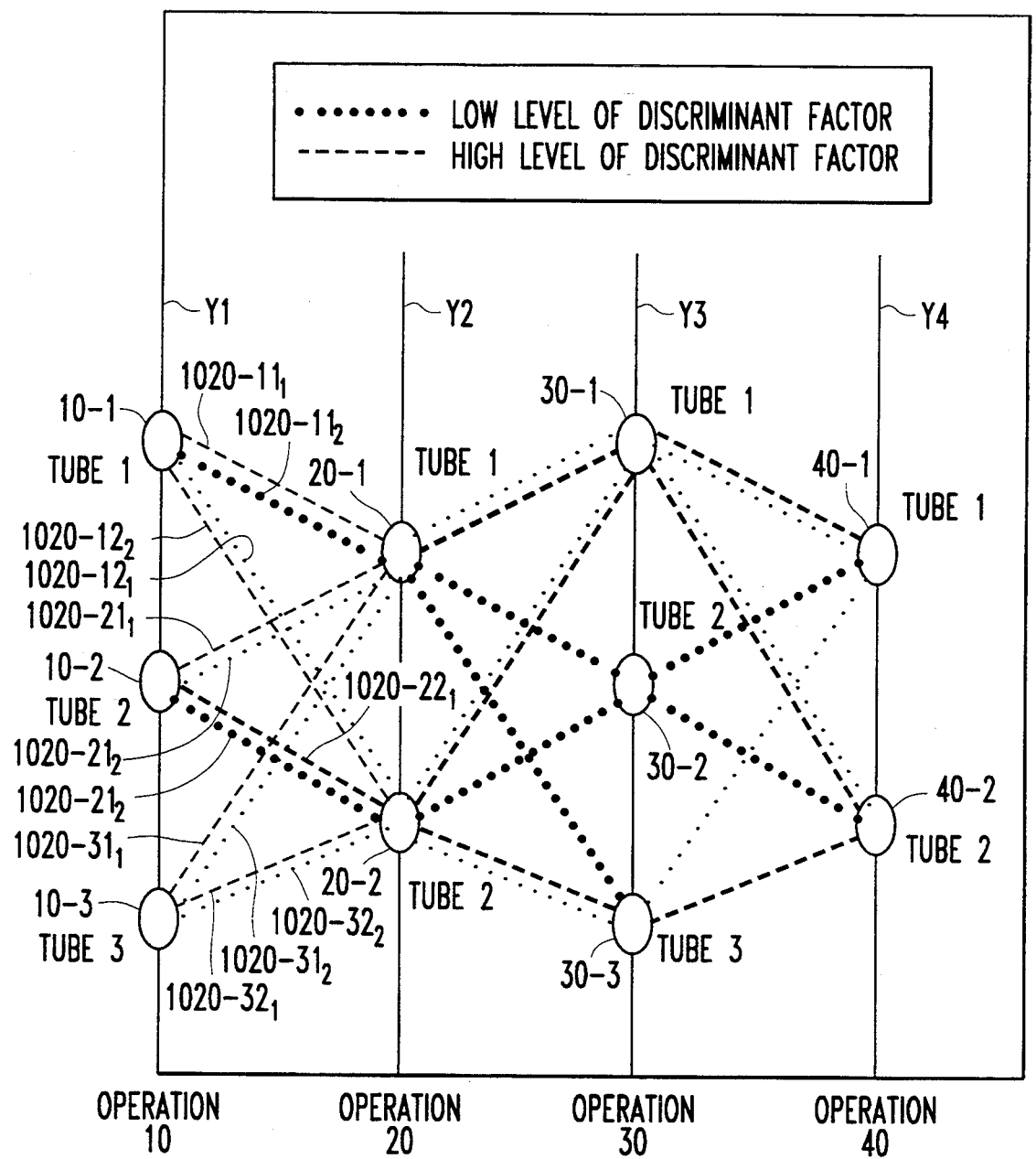
FIG. 2 diagrammatically illustrates a parallel coordinate system graphic display of four sequential semiconductor processing operations, respectively identified along a sequential operation axis.

Such a parallel coordinate system graphic display is preferably of the type described in an article by A. Inselberg, entitled: "Visualizing Multi-dimensional Structure Using Parallel Coordinates," 1989 Proceedings of the 24th Symposium on the Interface Computing Science and Statistics, pp 175–189. For purposes of providing a reduced complexity example, FIG. 2 diagrammatically illustrates such a parallel coordinate system-based graphic display as a non-limiting simplified diagram containing only four sequential semiconductor processing operations, respectively identified along a sequence order or X-axis, as comprising the temporal sequence: 'Operation 10', 'Operation 20', 'Operation 30' and 'Operation 40'. (It should be realized, however, as pointed out previously, that a typical batch processing sequence may include several tens to several hundred sequential operations to which the wafers are subjected. The number shown here is merely for purposes of providing a manageable illustration and description.)

In the plot of FIG. 2, distributed along each vertical or Y-axis associated with respective operation are a plurality of nodes, each of which is associated with a respective classification or group of the process that is employed for that particular operation. For purposes of the present description, the factor illustrated will be considered to be a piece of processing equipment, in particular, a chemical processing chamber or 'tube', in which a given lot of wafers is inserted and subjected to chemical processing (e.g. vapor deposition, epitaxial growth, impurity diffusion).

In the processing flow example illustrated in FIG. 2, distributed along a first vertical or Y-axis (Y1), associated with Operation 10, are a plurality of nodes (three in the illustrated example) 10-1, 10-2 and 10-3, respectively associated with or representative of three respective chemical chambers, labelled as (diffusion) tube 1, tube 2 and tube 3. Distributed along a second Y-axis (Y2), associated with Operation 20, are two nodes 20-1 and 20-2, respectively associated with tube 1 and tube 2. Distributed along a third Y-axis (Y3), associated with Operation 30, are three nodes 30-1, 30-2 and 30-3 respectively associated with tube 1, tube 2 and tube 3. Finally, distributed along a fourth Y-axis (Y4), associated with Operation 40, are two nodes 40-1 and 40-2, corresponding to tube 1 and tube 2, respectively.

In a batch semiconductor manufacturing system, in the course of processing substantial numbers of lots of wafers over various flow paths through the system, for a reduced node complexity flow network, such as the four axis network shown in FIG. 2, which contains no more than three nodes per axis, statistical probability results in the likelihood that every possible flow path will be traversed by at least one lot. For the illustrated example, this likelihood is fulfilled by a travel path link joining every node on each operation axis (Y-axis) to every node in an immediately previous or upstream operation and to every node in an immediately sequential or downstream operation.

In FIG. 2, node 10-1 of operation 10 is connected to node 20-1 of operation 20 by a pair of travel path links $1020\text{-}11_1$ and $1020\text{-}11_2$. Travel path link $1020\text{-}11_1$ is depicted as a relatively thin dashed or broken line, having a first visual characteristic (e.g. 'dashed' or 'broken' as in the case here, or other visually perceived attribute, such as color, cross-hatching and the like) associated with a first level of prescribed discriminant factor. Similarly, travel path link $1020\text{-}11_2$ is depicted as a relatively thick 'broken' line, the broken line providing a second visual characteristic associated with a second level of the prescribed discriminant factor, different from the first level (dotted).

As pointed out above, the discriminant factor, which defines the quality of each lot, may be a general discriminant, such as product yield, or a more specific discriminant, for example that associated with a measured circuit parameter, such as a prescribed offset voltage or propagation delay, or measurable defects in the materials of the wafer itself. For the example illustrated in FIG. 2, letting the discriminant correspond to product yield, as a non-limiting example, the length of a line segment (dotted being shorter than a broken segment) has been chosen to represent the level of product yield; specifically, a broken line, as that of travel path link 1020-11$_1$, represents a high level of product yield, while a dotted line, such as that of travel path link 1020-11$_2$, represents a low level of product yield.

A second attribute of each line, here its thickness, is proportional to the number of lots traversing the process flow path represented by the line. A prescribed 'thinnest' line, such as link 1020-11$_1$, represents a single lot. As more lots traverse a path between nodes the line becomes correspondingly thicker. Namely, the thicker or wider the line, the more lots along that path; conversely a thinner line means fewer lots have traversed that path.

In the example illustrated in FIG. 2, travel path broken line 1020-11$_1$ connecting nodes 10-1 and 20-1 is relatively thin, meaning that only a single lot having a high level of product yield (the discriminant factor, of the present example) has been processed in tube 1 at operation 10 and then processed again in tube 1 at operation 20. On the other hand, dotted line 1020-11$_2$ is considerably thicker (the dots are large), meaning that a plurality of lots of wafers having a low product yield have been processed in tube 1 at operation 10 and then processed again in tube 1 at operation 20.

FIG. 2 also shows node 10-1 of operation 10 connected to node 20-2 of operation 20 by a thinnest, broken travel path link 1020-12$_1$ and a thinnest, broken travel path link 1020-12$_2$, implying that only a single lot having a high level of product yield has been processed in tube 1 at operation 10 and then processed in tube 2 at operation 20, and that only a single lot having a low level of product yield has been processed in tube 1 at operation 10 and then processed in tube 2 at operation 20.

FIG. 2 further shows node 10-2 of operation 10 connected to node 20-1 of operation 20 by respectively dotted and broken travel path lines 1020-21$_1$ and 1020-21$_2$, implying that only a single lot having a high level of product yield has been processed in tube 2 at operation 10 and then processed in tube 1 at operation 20, and that only a single lot having a high level of product yield factor has been processed in tube 2 at operation 10 and then processed in tube 1 at operation 20.

Node 10-2 of operation 10 is further shown as being connected to node 20-2 of operation 20 by relatively thick dotted and broken travel path links 1020-22$_1$ and 1020-22$_2$, respectively, implying that many lots having both high and low levels of product yield have been processed in tube 2 at operation 10 and then processed in tube 2 at operation 20.

Node 10-3 of operation 10 is connected to node 20-1 of operation 20 by a pair of dotted and broken thin travel path links 1020-31$_1$ and 1020-31$_2$, implying that only a single lot having a high low of product yield has been processed in tube 3 at operation 10 and then processed in tube 1 at operation 20, and that only a single lot having a high level of product yield has been processed in tube 3 at operation 10 and then processed in tube 1 at operation 20.

Finally, for operation 10, node 10-3 is connected to node 20-2 of operation 20 by a pair of dotted and broken thin travel path links 1020-32$_1$ and 1020-32$_2$, implying that only a single lot having a low level of product yield has been processed in tube 3 at operation 10 and then processed in tube 2 at operation 20, and that only a single lot having a high level of product yield has been processed in tube 3 at operation 10 and then processed in tube 2 at operation 20.

The remaining nodes of the process flow diagram of FIG. 2 are also interconnected by travel path links, whose thickness and segmenting lengths are respectively associated with the number of lots and level of product yield.

Using these visual indicators in the flow diagram of FIG. 2, it is possible to readily pick out those nodes which have inordinately high or low concentrations of given levels of product yield. Processing equipment (e.g. a diffusion tube) which exhibits a high frequency of lots passing through it with a particular discriminant level might be a possible cause of the level of the discriminant factor. In the illustrated example, all lots having a low level of the product yield are shown as having been processed through node 2 (corresponding to diffusion tube 2) at operation 30. Since tube 2 (node 2) has both high and low levels of product yield at other operations in the process flow, it may be inferred that whatever is affecting the process is unique to operation 30 and tube 2. For operation 30, the illustrated results would seem to indicate that the other two tubes (tube 1 and tube 3) may be adversely affecting the discriminant factor (product yield in the present example).

Thus, it can be seen that the parallel coordinate system-based graphic display diagram of the type shown in FIG. 2 visually presents discriminant factor data associated with sequential process flow in a manner that readily enables the data analyst to simply look for convergence of travel path lines of a line attribute of interest (e.g. line segment length) at nodes of the process. Moreover, although the graphic display of FIG. 2 is a two-dimensional diagram, it should be realized that additional information may be added to the display mechanism by way of a further (Z) axis, which extends orthogonal to each of the X and Y axes, and employing this additional axis to represent a further process flow factor. The travel paths of the wafer lots would then take on three-dimensional shapes, readily perceptible to the human visual system, by way of the video display terminal through which the graph is generated. The third axis could represent, for example, the time at which the process event of interest is performed, the operator on duty at the time of the process event, etc., thereby providing additional information to expedite a data analyst's determination.

As will be appreciated from the foregoing description, the problem of analyzing product data, in order to determine at what point or points in a batch manufacturing process sequence the cause of a defective device has occurred, is effectively remedied in accordance with the present invention, by compiling data associated with the respective nodes of a multi-node sequential flow process, in particular, specified operation points of a semiconductor batch manufacturing process, in the form of easily perceived visual indicators, in particular weighted lines that interconnect successive nodes of the process graphically represented by means of a parallel coordinate system. The use of discriminant level-based visual indicator links of the graphics display according to the invention enables a system analyst to readily identify a node that is a likely candidate for either the cause of an anomaly that has contributed to a failed wafer, or to identify a node that is likely not to have contributed to a failed wafer. In the latter case examination of that node's associated processing component may prove to be indicative of a properly operating aspect of the process and thereby useful as a frame of reference for adjusting or calibrating other components of the process.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

APPENDIX

```
mod.matrix.to.unique < — function(inmat)
(
# change all cols of a matrix to index into unique set
    if(mode(inmat) !="numeric") {
        for (i in 1:ncol(inmat)) {
            unique.set < — unique(inmat[,i])
                unique.set)])
        )
    )
    mode (inmat) < — "numeric"
    return(inmat)
)
find.ymax < function(inmat)
(
    ymax <-0
    for (i in 1:ncol(inmat))
        ymax < — max(ymax, length(unique(inmat[, i])))
    return(ymax)
)
discritize.vec < function(invec, ymax, nsegments)
(
    if (missing(nsegments)) nsegments < — 3
# turns a col of a matrix into a col of max(ymax, 3) distinct
values invec < invisible(as.numeric(cut(invec, nsegments)))
    return(invec)
)
create.polygons < function(inmat, class, thelist)
(
    lr < — nrow(inmat)
    lc < — ncol(inmat)
    for(i in 1:lr)
        thelist < add.polygon(inmat[i, ], class[i], thelist)
    return(thelist)
)
add.polygon < — —function(invec, class, thelist)
(
    stepsize < — 0.05
    minlinewidth < — 0.01
    l < — length(invec)
    for (i in 1:(l — 1)) (
        if(mem     < —    is.member(thelist$xmat,thelist$ymat,
            thelist$colvec,
            i, i, ' 1, invec(i], invec[i + 1], class))
        thelist$lwdvec[mem] < — thelist$lwdvec[mem] +
            stepsize
        else (
            thelist$xmat < — rbind(thelist$xmat, c(i, i, i + 1, i +
                1)
            thelist$ymat < — rbind(thelist$ymat, c(invec[i], invec[i],
                invec[i + 1], invec[i + 1]))
            thelist$colvec < — c(thelist$colvec, class)
            thelist$lwdvec < — c(thelist$lwdvec,minlinewidth)
        return(thelist)
)
is/member < — function(xmat, ymat, colvec, x1, x2, y1, y2, col)
(
# checks for last four args as members of x and y matricies,
returns
# row number if found, zero if not.
    found < — 0
    if(is.null(xmat) && is.nul(ymat) && is.null(colvec))
        return(found)
    for(i in 1:nrow(xmat))
```

APPENDIX -continued

```
        if(all(xmat[i, ]— c(rep(x1, 2), rep(x2,2))) &&
            all(ymat[i,]— c(rep(y1, 2))) rep(y2,2))) &&
            colvec[i]— col)
                found < —i
    return(found)
)
dpp < — function(thelist, xmax, ymax)
(
    ymax < — max(thelist$ymat)     # makes parallel coordinate
        plot
    plot (1:xmax, seq(1, ymax, length = xmax), type = "n",
        yaxt -"n", xaxt = "n", ylab = "", xlab = "")
    for (i in 1:xmax)
        lines (c(i, i), c(l, ymax)) # now set linewidths
    thelist$ymat[,c(2, 3)] < — thelist$ymat[, c(2, 3)] +
        thelist$]wdvec
    ford in 1:nrow(thelist$ymat))
        polygon(thelist$xmat[i, ], thelist$ymat[i, ], col =
            thelist$colvec[i])
    return(thelist)
)
mpp < — function(inmat, invec)
(
# control program for parallel coordinate plot of process
# change matrix to unique values
    umat < — mod.matrix.to.unique(inmat)
    ymax < find.ymax(umat) # now combine dep variable into
        matrix
    thelist < — lists
    invec < — discritize.vec(invec,ymax) # draw the plot
    thelist < — create.polygons(umat, invec, thelist)
    thelist < — adjust.y(thelist)
    thelist < — dpp(thelist, ncol(umat), ymax)
    text.labels < — make.text.labels(umat, inmat)
    text(text.labels$x, text.labels$y, lab = text.labels$labels)
)
```

What is claimed:

1. In a process for manufacturing semiconductor circuit devices, in which respective lots of semiconductor workpieces are subjected to a plurality of sequential semiconductor processing operations, a method of enabling the occurrence of a process yield-impacting anomaly in said process to be readily identified, so that correction of the identified anomaly may improve the yield of the circuit devices manufactured by said process comprising the steps of:

(a) generating a multi-dimensional graphical display of said plurality of sequential operations, said graphical display containing a plurality of parallel axes, each axis being associated with a respective one of said plurality of sequential operations and having displayed thereon one or more elements associated with components employed by a respective operation of said process;

(b) specifying a discriminant factor as being representative of a prescribed characteristic of a semiconductor workpiece that has been subjected to said plurality of sequential operations;

(c) generating a plurality of respectively different visual indicators associated with respectively different levels of said discriminant factor; and (d) for each lot of semiconductor workpieces that has been subjected to said plurality of sequential semiconductor processing operations, generating on said display selected ones of said plurality of respectively different visual indicators which interconnect elements of said multi-dimensional graphical display to plot the sequential operation travel path of said each lot through said process, said selected ones of said plurality of respectively different visual indicators being selected in dependence upon the manner in which said one or more components employed by said plurality of sequential operations affect said prescribed characteristic of the respective lots of semiconductor workpieces.

2. A method according to claim 1, wherein step (d) comprises, for a respective lot of semiconductor workpieces that has been subjected to successive semiconductor processing operations, designating the process flow travel path from an ith semiconductor processing operation to an (i+1)th semiconductor processing operation by a selected one of said plurality of respectively different visual indicators in dependence upon the manner in which the component employed by said ith semiconductor processing operation affects said prescribed characteristic of said respective lot of semiconductor workpieces.

3. A method according to claim 2, wherein step (d) comprises interconnecting elements associated with components of successive ith and (i+1)th semiconductor processing operations by a prescribed one of said plurality of respectively different visual indicators, a first attribute of which depends upon the manner in which the component employed by said ith semiconductor processing operation affects said prescribed characteristic of each lot of semiconductor workpieces that has been processed by said components of said successive ith and (i+1)th semiconductor processing operations, and a second attribute of which is representative of the number of lots of semiconductor workpieces that has been processed by said components of said successive ith and (i+1)th semiconductor processing operations and which have said first attribute as a result of being affected by the component employed by said ith semiconductor processing operation.

4. A method according to claim 3, wherein said first attribute corresponds to the composition of a visual indicator interconnecting elements associated with components employed by said successive ith and (i+1)th semiconductor processing operations.

5. A method according to claim 4, wherein said composition of a visual indicator corresponds to line segment size, hatching, shading or color.

6. A method according to claim 4, wherein said second attribute corresponds to the thickness of a visual indicator interconnecting elements associated with components employed by said successive ith and (i+1)th semiconductor processing operations.

7. A method according to claim 1, further including the steps of:

(e) locating an element on said display at which a plurality of like type visual indicators intersect;

(f) analyzing the component employed by a respective operation of said process associated with the element on the display located in step (e), so as to determine the operational performance of the component; and (g) selectively modifying the component employed by a respective operation of said process associated with the located element, in accordance with results of the analysis of the component in step (f).

8. A method according to claim 7, wherein step (g) comprises modifying the component employed by a respective operation of said process associated with the located element, so as correct a yield-impacting anomaly of said component.

9. A method according to claim 7, wherein step (g) comprises replacing the component employed by a respective operation of said process associated with the located element by a new component.

* * * * *